United States Patent
Josefsson

(10) Patent No.: US 9,722,561 B2
(45) Date of Patent: Aug. 1, 2017

(54) SYSTEMS AND APPARATUS PROVIDING FREQUENCY SHAPING FOR MICROPHONE DEVICES AND METHODS OF OPERATION OF THE SAME

(71) Applicant: INVENSENSE, INC., San Jose, CA (US)

(72) Inventor: Olafur Mar Josefsson, Hafnarfjordur (IS)

(73) Assignee: INVENSENSE, INC., San Jose, CA (US)

( * ) Notice: Subject to any disclaimer, the term of this patent is extended or adjusted under 35 U.S.C. 154(b) by 157 days.

(21) Appl. No.: 14/624,910

(22) Filed: Feb. 18, 2015

(65) Prior Publication Data

US 2016/0241961 A1   Aug. 18, 2016

(51) Int. Cl.
*H03G 5/00*  (2006.01)
*H03G 5/16*  (2006.01)
*H04R 3/04*  (2006.01)
*H03G 3/32*  (2006.01)

(52) U.S. Cl.
CPC ............ *H03G 5/165* (2013.01); *H03G 5/005* (2013.01); *H04R 3/04* (2013.01); *H03G 3/32* (2013.01); *H04R 2201/003* (2013.01)

(58) Field of Classification Search
CPC ..... H04R 3/06; H04R 2201/003; H03G 5/165

USPC .................................................. 381/103, 101
See application file for complete search history.

(56) References Cited

U.S. PATENT DOCUMENTS

| 2013/0195291 A1* | 8/2013 | Josefsson | H02M 3/07 381/174 |
| 2014/0177874 A1* | 6/2014 | Bogason | H04R 1/005 381/111 |

* cited by examiner

*Primary Examiner* — Vivian Chin
*Assistant Examiner* — Ammar Hamid
(74) *Attorney, Agent, or Firm* — Amin, Turocy & Watson, LLP

(57) ABSTRACT

A device is provided. The device includes: a sensor adapted to receive an acoustic wave and generate an electrical signal in response to receipt of the acoustic wave; clock frequency detection circuitry adapted to receive a clock signal, detect a frequency of the clock signal and generate information representative of the frequency; and digital filter circuitry coupled to the clock frequency detection circuitry. The digital filter circuitry is adapted to: receive the clock signal and the information representative of the frequency; access a first set of one or more digital filter coefficient values; and selectively change the first set of the one or more digital filter coefficient values to a second set of one or more digital filter coefficient values based on the information representative of the frequency, wherein the one or more digital filter coefficient values are included within a plurality of digital filter coefficient values.

33 Claims, 7 Drawing Sheets

SYSTEMS AND APPARATUS PROVIDING FREQUENCY SHAPING FOR MICROPHONE DEVICES AND METHODS OF OPERATION OF THE SAME

TECHNICAL FIELD

Embodiments of the subject disclosure relate generally to microphone devices, and particularly to frequency shaping for signals output from microphone devices.

BACKGROUND

With current technology, integrated analog approaches to altering high pass corner frequency of a signal output from a device, such as an acoustic sensor, can be problematic because such approaches may affect the noise of the overall system due to thermal noise associated with analog filtering. The same problems can arise from integrated analog countermeasures against resonance peaking. Further, analog approaches that use discrete components may be expensive and not trimmable. Additionally, digital filtering approaches may be problematic because the frequency response typically scales with the clock frequency received at the digital filter.

SUMMARY

In one embodiment, a device is provided. The device may include: a sensor that causes an electrical signal to be generated in response to a sensor measurement; clock frequency detection circuitry adapted to receive a clock signal, detect a frequency of the clock signal and generate information representative of the frequency; and digital filter circuitry coupled to the clock frequency detection circuitry. The digital filter circuitry is adapted to: receive the clock signal and the information representative of the frequency; access a first set of one or more digital filter coefficient values; and selectively change the first set of the one or more digital filter coefficient values to a second set of one or more digital filter coefficient values based on the information representative of the frequency, wherein the one or more digital filter coefficient values are included within a plurality of digital filter coefficient values. The digital filter circuitry may or may not be on the same silicon as the rest of the application specific integrated circuit (ASIC) circuitry in various embodiments. The digital filter circuitry also receives the digitized electrical signals from the acoustic sensor. The acoustic sensor can be a MEMS sensor.

In another embodiment, a method is provided. The method includes: receiving an acoustic wave by using a sensor; generating an electrical signal associated with the acoustic wave; and receiving a clock signal. The method also includes detecting a frequency of a clock signal; generating information associated with the frequency; and using the information associated with the frequency to selectively change a first set of one or more digital filter coefficient values to a second set of one or more digital filter coefficient values based on the frequency of the clock signal, wherein the first set of one or more digital filter coefficient values and the second set of one or more digital filter coefficient values are coefficient values of a plurality of digital filter coefficient values.

In yet another embodiment, a package is provided. The package includes: at least one of a microphone, motion sensor, a pressure sensor or an environmental sensor adapted to generate an electrical signal; clock frequency detection circuitry adapted to receive a clock signal, detect a frequency of the clock signal and generate information representative of the frequency; and digital filter circuitry coupled to the clock frequency detection circuitry. The digital filter circuitry is also adapted to: receive the clock signal and the information representative of the frequency; access a first set of one or more digital filter coefficient values; and selectively change the first set of the one or more digital filter coefficient values to a second set of one or more digital filter coefficient values based on the information representative of the frequency, wherein the one or more digital filter coefficient values are included within a plurality of digital filter coefficient values.

In yet another embodiment, another device is provided. The device includes: at least one of a microphone, motion sensor, a pressure sensor or an environmental sensor adapted to generate an electrical signal; and clock frequency detection circuitry adapted to receive a clock signal, detect a frequency of the clock signal and generate information representative of the frequency. The device also includes switched capacitor circuitry having first capacitor circuitry and second capacitor circuitry and coupled to the clock frequency detection circuit, wherein the switched capacitor circuitry is adapted to receive the clock signal and selectively activate or bypass the first capacitor circuitry or the second capacitor circuitry based on the information representative of the frequency to reduce or eliminate the effect of the frequency of the clock signal on a frequency response of the switched capacitor circuitry.

In yet another embodiment, a system is described. The system can include a microphone device having a clock and a clock frequency detector; and digital filtering circuitry coupled to the microphone device. The digital filtering circuitry is adapted to: receive information about the frequency of the clock of the microphone device from the clock frequency detector; and adjust filtering of an electrical signal generated by the microphone device based on the information.

In another embodiment, an integrated circuit (IC) package is provided. The IC package includes a clock; and a first chip coupled to the clock and including a sensor, a clock frequency detection circuitry and an interface configured to communicate with a second chip. The package also includes the second chip coupled to the clock and including digital filter circuitry having analog to digital conversion circuitry, wherein the digital filter circuitry is configured to: use a signal generated by the clock frequency detection circuitry to generate information representative of the frequency of the clock; access a first set of one or more digital filter coefficient values; and selectively change the first set of the one or more digital filter coefficient values to a second set of one or more digital filter coefficient values based on the information representative of the frequency, wherein the one or more digital filter coefficient values are included within a plurality of digital filter coefficient values.

In another embodiment, a system is provided. The system can include a clock; and a first chip coupled to a clock and including a sensor, an analog to digital conversion circuitry, clock frequency detection circuitry and an interface, wherein the interface is configured to communicate with a second chip. The system can also include the second chip coupled to the clock and including digital filter circuitry configured to: use a signal generated by the clock frequency detection circuitry to generate information representative of the frequency of the clock; access a first set of one or more digital filter coefficient values; and selectively change the first set of the one or more digital filter coefficient values to a second set of one or more digital filter coefficient values based on the information representative of the frequency, wherein the one or more digital filter coefficient values are included within a plurality of digital filter coefficient values.

A further understanding of the nature and the advantages of particular embodiments disclosed herein can be realized by reference of the remaining portions of the specification and the attached drawings.

DETAILED DESCRIPTION

Figure 1:
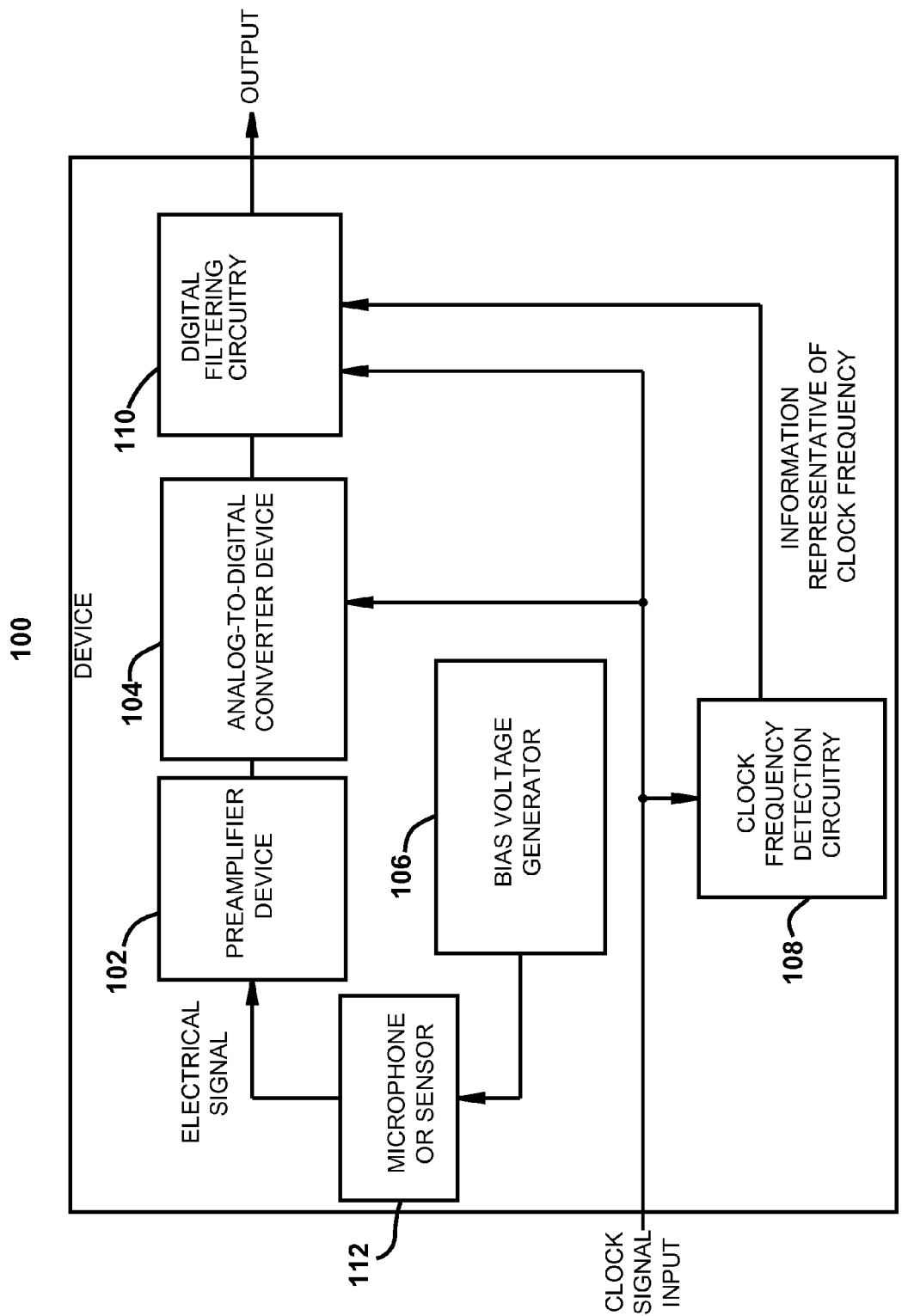
FIG. 1 illustrates an exemplary circuit of a device that provides frequency shaping via a combination of digital filter circuitry and clock frequency detection circuitry in accordance with one or more embodiments described herein.

A microphone is a device that converts sound pressure from acoustic waves received at a sensor to electrical signals. Microphones are used in numerous different applications including, but not limited to, hearing aids, voice recordation systems, speech recognition systems, audio recording and engineering, public and private amplification systems and the like.

Micro-electromechanical systems (MEMS) microphones have numerous advantages including low power consumption and high performance. Additionally, MEMS microphones are available in small packages and facilitate use in a wide variety of applications that require a device with a small footprint. A MEMS microphone typically functions as a capacitive-sensing device, or acoustic sensor, that includes a pressure-sensitive diaphragm that vibrates in response to sound pressure resultant from an acoustic wave incident on the diaphragm. The acoustic sensors are often fabricated employing silicon wafers in highly-automated production processes that deposit layers of different materials on the silicon wafer and then employ etching processes to create the diaphragm and a plate. The air moves through the plate to the diaphragm, which deflects in response to the sound pressure associated with the air. The terms "microphone" and "microphone devices" are synonymous and are used interchangeably herein. Additionally, while MEMS microphones are discussed, in some cases, the microphones and microphone devices described herein can include electret condensor microphones (ECMs), piezoelectric material-based microphones, or any other types of microphones.

The sensed phenomenon from the microphone is converted into an electrical signal. The electrical signal can be processed by an ASIC for performing any number of functions of the microphone or, in some cases, the electrical signal can be processed for performing any number of functions (e.g., audio speech processing, encoding, decoding, ultrasonic gesture detection).

A difficulty with digital filtering approaches to altering the native microphone frequency response in a given package is that the frequency response of digital filters scale with the clock frequency being input to the component, which can be a combination of a microphone and ASIC combined within a package. There are several reasons that it may be desirable to change the native frequency response. For example, when a designer is designing a sensor (e.g., MEMS sensor), there are many possible constraints on the design; however, one constraint is the frequency response required by the customer for which the sensor is being built. The frequency response constraint can determine how hard or how costly it is to meet other system specifications. However, one or more embodiments described herein can relax the frequency response requirement on the device (e.g., MEMS device, ECM device, piezoelectric material-based devices), and thereby allow more design flexibility for other specifications for modular design of the overall microphone (e.g., MEMS microphone, piezoelectric material-based microphone, ECM) package.

One or more embodiments described herein can overcome one or more difficulties described previously by using clock frequency detection circuitry that outputs information representative of the frequency of an input clock signal and by the digital filter circuitry adjusting coefficients according to the frequency of the clock signal. In some embodiments, the frequency of the clock signal can be the measured rate of the clock. In some embodiments, discrete-time switched capacitor filtering can be performed as an alternative to digital filtering. Following this approach, one or more embodiments described herein can output an electrical signal from the device that is filtered to maintain a fairly constant frequency response across a wide range of clock frequencies.

Turning now to the drawings, FIG. 1 illustrates an exemplary circuit of a device (e.g., MEMS device) that provides frequency shaping via a combination of digital filter circuitry and clock frequency detection circuitry in accordance with one or more embodiments described herein. Device 100 can include digital filter circuitry 110, microphone or sensor 112 (e.g., MEMS microphone or sensor; piezeoelectric material-based microphone (e.g., piezoelectric MEMS microphone) or sensor; ECM), preamplifier device 102, analog-to-digital converter (ADC) device 104, bias voltage generator 106 and/or clock frequency detection circuitry 108. In various embodiments, one or more of the digital filter circuitry 110, microphone or sensor 112, preamplifier device 102, ADC device 104, bias voltage generator 106 and/or clock frequency detection circuitry 108 can be electrically and/or communicatively coupled to one another to perform one or more functions of the device 100 (or one or more components of the device 100).

Microphone or sensor 112 can include any number of different devices including, but not limited to, a MEMS microphone having a MEMS acoustic sensor (not shown) that can receive acoustic waves and convert the acoustic waves to an electrical signal indicative of the acoustic waves received.

By way of example, but not limitation, the MEMS acoustic sensor can include a diaphragm (not shown) and a back plate (not shown) provided substantially parallel to one another to form a capacitor. The diaphragm can be a pressure-sensitive membrane and/or can be a micro-machined structure that deflects or otherwise locates to a new position in response to an acoustic wave incident on the diaphragm. In some embodiments, an electrode (not shown) can be electrically coupled to the acoustic sensor to enable measurement/detection of an amount of displacement of the diaphragm. As described, the diaphragm can be positioned substantially parallel to the back plate when the diaphragm is at rest (e.g., not experiencing deflection). In some embodiments, at least a portion of the diaphragm and the back plate are positioned substantially parallel to one another when the diaphragm is at rest.

In some embodiments, in lieu of or in addition to device 100 having an acoustic sensor, the microphone or sensor 112 can include one or more different types of sensors. For example, the microphone or sensor 112 can be or include at least one of a motion sensor, a pressure sensor or an environmental sensor adapted to generate an electrical signal. For example, the electrical signal can be indicative of the measured/detected motion, pressure and/or environment condition identified by the corresponding motion sensor, pressure sensor and/or environment sensor.

Bias voltage generator 106 can generate a bias voltage to power on and/or allow operation of the microphone or sensor 112. For example, in embodiments in which the microphone or sensor 112 is a MEMS microphone, bias voltage generator 106 can output bias voltage to the MEMS device to enable the MEMS microphone to process acoustic waves, record information indicative of the acoustic waves (e.g., acoustic signals) and/or generate the electrical signals indicative of the received acoustic waves.

Preamplifier device 102 receives the electrical signal output from the microphone or sensor 112 and processes the electrical signal for further amplification or processing (e.g., processing for subsequent filtering by the digital filter circuitry 110 and/or switched capacitor circuitry 202). For example, the preamplifier device 102 can be an electrical device that increases the electrical signal strength without degrading the signal-to-noise ratio of the electrical signal. In embodiments in which the microphone or sensor 112 is a MEMS microphone, the preamplifier device 102 can be or include a microphone preamplifier, which can increase the electrical signal from the microphone (e.g., microphone signal) to a level desired or useful for further processing by other devices.

The electrical signal can be received by the ADC device 104 from the preamplifier device 102. The ADC device 104 can convert the electrical signal from an analog signal to a digital signal. In some embodiments, the ADC device 104 can be or include a delta sigma modulator. The digital version of the electrical signal can be output from the ADC device 104 and received by the digital filter circuitry 110.

The digital filter circuitry 110 can be adapted to receive a clock signal input to the device 100 and/or input to a component of the device 100, and to also receive information representative of the frequency of the input clock signal. For example, the clock frequency detection circuitry 108 can receive a clock signal and output information indicative of the clock frequency. By way of example, but not limitation, the information representative of the clock frequency can be or include one or more values or one or more bits (e.g., an N-bit sequence or N bits of information or N values) that describe the clock signal frequency detected/measured by the clock frequency detection circuitry 108. The clock frequency detection circuitry 108 can output a digital representation of the information representative of the clock frequency in embodiments such as that shown in FIG. 1 in which the digital filter circuitry 110 is included and employed in the device 100.

As shown, the digital filter circuitry 110 can also receive the electrical signal output from the ADC device 104. The digital filter circuitry 110 can filter the electrical signal output from the ADC device 104 to maintain a fairly constant frequency response of the electrical signal notwithstanding changes in the input clock signal occur from time to time (e.g., when the clock operates in a low-power mode for a first time period and operates in a high-power mode for a second time period, or vice versa). The case in which the digital filter circuitry 110 accepts only two distinct clock frequencies, one representing low power mode and the other normal (or high performance) mode, is one of many possible cases. However, more typically, low power mode is represented by a range of clock frequencies, and normal mode is represented by a higher range of clock frequencies separated from the lower range. In many cases, the digital filter circuitry 110 can select between two or more different sets of filter coefficients. The different sets of coefficients can be selected based on the information indicative of the frequency of the clock signal input to the clock frequency detection circuitry 108.

In some embodiments, the digital filter circuitry 110 can access digital filter coefficients stored at a separate component (e.g., a memory) or hard-wired as part of the digital filter circuitry 110. In some embodiments, in lieu of a separate processor, the digital filter circuitry 110 can include a hard-coded (e.g., non-programmable) digital engine/digital signal processor in some embodiments. In some embodiments, the digital filter circuitry 110 can include or be electrically and/or communicatively coupled to an off-chip generic programmable processor/digital signal processor.

In one embodiment, two distinct input clock frequencies can be expected. However, more typically, the embodiments described herein, there may be a range of clock frequencies at which device 100 should be in low power mode and another range of clock frequencies at which device 100 should be in normal mode. As such, the clock frequency detection circuitry 108 may be configured to detect a wide range of input clock frequencies and, for a given input clock frequency, select the most suitable set of coefficients from multiple sets of available filter coefficients. The accuracy of the clock detection by the clock frequency detection circuitry 108 and the granularity of filter coefficients available for selection can differ in different embodiments depending on how narrowly the frequency response of the digital filter circuitry 110 has to be controlled across allowable input clock frequencies. In some embodiments, the granularity can be a result of a system specification (e.g., maximum sensitivity variation allowed across a range of acoustic signal input frequencies).

As another example, to achieve superior fidelity in audio that humans can hear, 20 kilohertz (kHz) bandwidth is typically utilized in a system. However, such bandwidth range typically is associated with a corresponding clock signal at a defined frequency (e.g., at least 2.4 megahertz (MHz)) to capture the music and voice of the audio with clarity. In some embodiments, the specification for a MEMS microphone can be reduced to allow a microphone frequency of 1 MHz or less (and the clock frequency will correspondingly drop below 1 MHz). For example, this mode can be a low-power mode, while the higher frequency clock behavior is consistent with that of a higher-power mode. However, one or more of the embodiments described herein can filter via the digital filtering circuitry 110 to obtain a substantially constant frequency response for the microphone signal notwithstanding the clock frequency changes between low-power mode and the higher-power mode. The time period during which the clock frequency changes from the low-power mode to the higher-power mode can also include a short blackout period that allows the clock frequency detection circuitry to become aware of the new mode being demanded or requested.

The digital filter circuitry 110 can be configured to provide filtering according to one or more different digital filter coefficient values (or one or more sets of different digital filter coefficient values). For example, the digital filter circuitry 110 can be composed of or access coefficients to be used by the digital filtering circuitry 110. The coefficients can affect the frequency response of the microphone or other device signal filtered by the digital filtering circuitry 110. In various embodiments, the coefficients are pre-stored/hard-wired in the digital filtering circuitry or other storage device (e.g., memory) and/or in use in the digital filter circuitry 110.

The digital filtering circuitry 110 can make assumptions about the incoming clock frequency in some embodiments. However, in other embodiments, the information about the incoming clock frequency can be output from the clock frequency detection circuitry 108 (which can be indicative of the actual input clock signal frequency at a particular time as opposed to an assumed input clock signal frequency) and, upon receipt by the digital filter circuitry 110, cause the digital filter circuitry 110 to alter the pre-existing digital filter coefficient values to new digital filter coefficient values so that the electrical signal will also be altered to have a desired frequency response. Accordingly, as the input frequency of the clock varies, the information representative of the clock frequency takes on one state and then if the system goes into low-power mode, for example, and the clock frequency changes to again (e.g., 1 MHz), the information representative of the clock frequency takes on a different state. The digital filter circuitry 110 can change to/adopt one or more different sets of digital filter coefficient values in response to the change in state.

As indicated above, this issue is more complicated than that if the clock can have more than just a few distinct frequencies (which is typically the case). Even when in a particular mode, the clock is allowed to vary. As such, the digital filter circuitry 110 is configured to adjust (while in the same state) according to the frequency of the input clock in order to maintain constant signal frequency response.

In some embodiments, a first digital filter coefficient value can be employed by the digital filter circuitry 110 for filtering the electrical signal received from the ADC device 104. After receipt of the information representative of the clock frequency from the clock frequency detection circuitry 108, the digital filter circuitry 110 can select or access a previously-stored digital filter coefficient value for loading into a register of the digital filter circuitry 110 to change the filtering operation of the digital filter circuitry 110 and result in a desired frequency response of the electrical signal from the ADC device 104 (notwithstanding the frequency of the clock signal has changed from a previous frequency or is a particular frequency that might otherwise result in a particular frequency response scaling or being otherwise undesirable). As such, the change in digital filter coefficient values can provide an amount of compensation for the frequency of the clock signal and/or the scaling/change in the frequency response of the electrical signal relative to circuits in which the digital filter circuitry 110 and clock frequency detection circuitry 108 as described herein are not provided.

In one embodiment, for example, digital filter circuitry 110 can be configured to select for one or more registers of the digital filter circuitry 110, a first set of one or more values for a first operating clock frequency and to select for one or more registers of the digital filter circuitry 110, a second set of one or more values for a second operating clock frequency detected by the clock frequency detection circuitry 108. The digital filter circuitry 110 can change the first set of the one or more values (e.g., digital filter coefficient values) to a second set of the one or more values to reduce or eliminate the effect of the frequency of the clock signal on a frequency response of the digital filter circuitry 110.

For example, the frequency response of the digital filter circuitry 110 from the processed electrical signal typically scales according to the frequency of the input clock signal. In lieu of having a scaled frequency response, the digital filter circuitry 110 can be configured to select a second set of one or more values for a second operating clock frequency detected by the clock frequency detection circuitry 108 to reduce or eliminate the effect of the frequency of the clock signal on a frequency response of the digital filter circuitry 110.

Although not shown, device 100 can also include a memory and a processor electrically and/or communicatively coupled to one another and/or to any number of the devices, components and/or circuitry of device 100 to perform one or more functions of device 100. For example, in some embodiments, the memory can include a number of memory locations. At least one memory location of the memory can be coupled to the digital filter circuitry 110 and can be adapted to store one or more digital filter coefficient values (or one or more sets of digital filter coefficient values). The one or more (or sets of one or more) digital filter coefficient values can dictate the filtering to be provided by the digital filter circuitry 110.

In various embodiments, the digital filter circuitry 110 can be or include a high pass filter, a band pass filter and/or a low pass filter band reject filter or a combination of these types of filters. In some embodiments, the digital filter circuitry 110 can include, but is not limited to, multipliers, registers and/or accumulators that multiply digital filter coefficient values, and/or perform summation of the products of the multiplication or the like.

In some embodiments, the digital filter circuitry 110 (or a memory accessible by the digital filter circuitry 110) can store a first subset of the digital filter coefficient values for a first clock frequency (e.g., 2 MHz) and store a second subset of the digital filer coefficient values for a second clock frequency (e.g., 4 MHz). In embodiments in which a clock frequency is determined by clock frequency detection circuitry 108 and the clock frequency is different from the clock frequencies associated with the stored clock frequency coefficients, the digital filter circuitry 110 can generate new digital filter coefficient values for the new clock frequency and/or interpolate between two existing digital filter coefficient values (or two existing sets of digital filter coefficients) previously-determined for other clock frequencies to calculate (on the fly or dynamically) a new digital filter coefficient value (or a new set of digital filter coefficient values) without need for storage of each digital filter coefficient value (or each set of digital filter coefficients) when each new clock frequency is identified by the clock frequency detection circuitry 108.

In some embodiments, the digital filter circuitry 110 can include an equalizer component (not shown) adapted to one of reduce or eliminate a resonance peak associated with the electrical signal (e.g., the electrical signal output from a sensor element of the microphone or sensor 112). For example, the digital filter circuitry 110 can equalize the overall frequency response of the microphone or sensor 112 in the major pass band (e.g., the band from 100 Hz to 10 kHz or even up to 20 kHz).

In some embodiments, the electrical signal can include a signal having an ultrasonic frequency, and the digital filter circuitry 110 can be adapted to either attenuate or amplify the electrical signal to maintain a substantially constant frequency response of the electrical signal for different input clock signal frequencies.

In FIG. 1, the output from the digital filter circuitry 110 can include any number of different digital signals including, but not limited to, a digital audio signal indicative of a verbal word spoken into the device 100 (e.g., when the device 100 is or includes a microphone). In some embodiments, the clock frequency detection circuitry 108, the digital filter circuitry 110 and a processor (not shown) are located on an application specific integrated circuit (ASIC) located in the device 100.

The clock frequency detection circuitry 108 can be circuitry configured to detect/measure/identify the frequency of a clock signal input to the device 100. For example, some type of clock frequency detection circuitry may be employed in digital microphones to optimize/improve power and/or other performance characteristics for different clock rates. As such, this circuitry and/or other circuitry can be enhanced or designed to result in the clock frequency detection circuitry 108 described herein, which can support digital filtering (as described with reference to FIG. 1) or analog filtering (as described with reference to FIG. 2) in a cost-efficient manner to result in a fairly constant frequency response across a number of different input clock signal frequencies.

In some embodiments, for example, a high pass corner can be considered. A customer may request a device that has a high frequency corner of 80 Hz+/−15 Hz. If the frequency response of a digital microphone is measured and it is determined that the high pass corner yields 80 Hz+/−15 Hz regardless of clock frequency, then analog components determine the high pass corner. If however, the high pass corner varies linearly within small clock ranges but changes back as the input clock moves out of that range (and this may happen repeatedly as the clock frequency is increased) then the device is altering the filtering characteristics as the clock frequency changes as described herein.

In some embodiments, the high pass corner frequency and/or resonance frequency of the electrical signal output from the microphone or sensor 112 can be affected by the packaging and/or the packaging process. For example, the high pass corner frequency of the device and/or the module (e.g., device and ASIC and/or the packaged device and ASIC combination) can be affected by the packaging and/or the packaging process.

Accordingly, the digital filter circuitry 110 can provide corrective filtering of the high pass corner frequency and/or resonance frequency in various embodiments. By way of example, but not limitation, the high pass corner frequency and/or the resonance frequency of the microphone or sensor 112 (e.g., a MEMS microphone) can be measured at the factory and information regarding corrective filtering stored in a memory location of the memory in the module. The clock frequency detection circuitry 108 can be tuned as well at the factory to enable accurate clock frequency detection. The combination of designing the digital filter circuitry 110 to provide corrective filtering and providing the clock frequency detection circuitry 108 that can identify the frequency of the input clock signal can allow digital filtering to provide the desired module frequency response across a wide range of clock frequencies.

In some embodiments, digital filter circuitry 110 can be coupled to the clock frequency detection circuitry 108 and can receive the clock signal and the information representative of the frequency. Digital filter circuitry 110 can access a first digital filter coefficient value, wherein the first digital filter coefficient value is a digital filter coefficient value of a plurality of digital filter coefficient values. Digital filter circuitry 110 can also selectively change the first digital filter coefficient value to a second digital filter coefficient value based on the information representative of the frequency, wherein the second digital filter coefficient value is also a digital filter coefficient value of the plurality of digital filter coefficient values. In some embodiments, one or more of the plurality of digital filter coefficient values are hard-wired into the digital filter circuitry 110. In some embodiments, one or more of the plurality of digital filter coefficient values are generated from hard-wired ones of the plurality of digital filter coefficient values.

Accordingly, one or more of the embodiments can alleviate the problem with digital filters of the frequency response scaling with the input clock and, instead, provide a solution that can result in a substantially fixed frequency response notwithstanding the input clock signal frequency is changing over time. For example, typically a MEMS microphone would have a high-pass corner frequency of 60 Hz; however, a high-pass corner frequency of 80 Hz may result in a MEMS module composed of a MEMS device, ASIC and packaging. One or more embodiments can shape the high-pass corner frequency from 60 Hz to 80 Hz if the input clock frequency is known. The embodiments described can combine digital filter circuitry with clock frequency detection circuitry, which is typically unrelated to and not used in conjunction with the digital filter circuitry.

Although not shown, in some embodiments, a device (e.g., device 100 of FIG. 1) can include a MEMS microphone transducer, MEMS sensor, ECM and/or an accompanying ASIC electrically and/or communicatively coupled to the device. The ASIC can include clock frequency detection circuitry configured to determine the frequency of clock signal applied from a device external to the device. The ASIC can receive a signal from the microphone transducer and/or sensor. The ASIC can also receive a clock input along with information indicative of the frequency of the clock signal.

Although not shown, in some embodiments, digital filtering circuitry can be located downstream of the microphone device and can be a separate component (e.g., located on an ASIC or in another component of a system) distinct from the microphone device, for example. While the microphone device can be electrically or communicatively coupled as part of the same electrical system, as before, the digital filtering circuitry can be at any location downstream of the microphone device and need not be located on an ASIC. The microphone device can include an internal clock. The digital filtering circuitry can be configured to receive information from a clock frequency detector of the microphone device and adjust the filtering of the signal output from the microphone device by adjusting one or more digital filter coefficient values as described herein.

In some embodiments, digital filtering circuitry can be located downstream of the microphone device and can be a separate component (e.g., located on an ASIC or in another component of a system) distinct from the microphone device, for example. While the microphone device can be electrically or communicatively coupled as part of the same electrical system, as before, the digital filtering circuitry can be at any location downstream of the microphone device and need not be located on an ASIC. The microphone device can include an internal clock. The digital filtering circuitry can be configured to monitor the clock of the microphone, perform clock frequency detection and corresponding adaption of the digital filter coefficient values used by the digital filtering circuitry to filter the signal output by the microphone device. In one or more embodiments, the digital filtering circuitry could be a part of a larger chip downstream that can also contain other functionality such as codec (e.g., encoding and/or decoding) functionality, audio speech recognition, ultrasonic gesture detection or the like. The chip can include a programmable processor of one type or another in various embodiments. Although encoding and decoding are provided as example codec functionality, in other embodiments, any number of other functionality can be considered codec functionality including, but not limited to, compression, decompression, encoding of signals or information for transmission, storage or encryption, decoding of signals or information for playback or editing.

Although not shown, in some embodiments, an integrated circuit (IC) package is provided. The IC package includes a clock; and a first chip coupled to the clock and including a sensor, a clock frequency detection circuitry and an interface configured to communicate with a second chip. The package also includes the second chip coupled to the clock and including digital filter circuitry having analog to digital conversion circuitry. In some embodiments, the digital filter circuitry is configured to: use a signal generated by the clock frequency detection circuitry to generate information representative of the frequency of the clock; access a first set of one or more digital filter coefficient values; and selectively change the first set of the one or more digital filter coefficient values to a second set of one or more digital filter coefficient values based on the information representative of the frequency, wherein the one or more digital filter coefficient values are included within a plurality of digital filter coefficient values. While the package is described as including a first chip and a second chip, in some embodiments, the components and circuitry described as being provided on the first chip and the second chip can be provided on the same chip.

In another embodiment (not shown), a system is provided. The system can include a clock; and a first chip coupled to a clock and including a sensor, an analog to digital conversion circuitry, clock frequency detection circuitry and an interface, wherein the interface is configured to communicate with a second chip. The system can also include the second chip coupled to the clock and including digital filter circuitry configured to: use a signal generated by the clock frequency detection circuitry to generate information representative of the frequency of the clock; access a first set of one or more digital filter coefficient values; and selectively change the first set of the one or more digital filter coefficient values to a second set of one or more digital filter coefficient values based on the information representative of the frequency, wherein the one or more digital filter coefficient values are included within a plurality of digital filter coefficient values.

In some embodiments, the first and the second chips are located in the same integrated circuit package. In some embodiments, the first chip is located in a first integrated circuit package and the second chip is located in a second integrated circuit package.

Turning back to FIG. 1, use of the digital filter circuitry 110 can, in some embodiments, result in a scalable solution that works well with various different input clock frequencies to maintain substantially constant frequency response. The use of the digital filter circuitry 110 can provide a scalable solution that is often superior to the scalability and efficiency resultant from use of an analog-based filtering solution. However, an analog-based solution is discussed below with reference to FIG. 2 and a switched capacitor circuitry 202.

Switched capacitor circuitry 202 can be configured to be selectively changed depending on the frequency of the clock. For example, the frequency of the clock signal used by the switched capacitor circuitry can be selectively changed based on the information representative of the frequency of the received clock signal to reduce or eliminate the effect of the frequency of the clock signal on a frequency response of the switched capacitor circuitry. In various embodiments, the switched capacitor circuitry can be configured to perform any of a number of the operations described herein.

Switch capacitor mixed signal/analog filters can be employed to generate a high pass filter to meet specific high pass frequency response requirements of a microphone. However, the switched capacitor circuitry can vary proportionally with the input clock frequency for the ASIC or the microphone (e.g., MEMS microphone or ECM) device. This can be remedied by changing the division ratio (depending on the exact clock frequency) from the externally applied input clock signal to an internal clock of the switched capacitor circuitry. A second approach can be to alter the switched capacitor circuitry depending on the frequency of the input clock signal. The third approach can be to combine the two previous approaches. However, these options can, in some embodiments, call for knowledge of the frequency of the input clock signal and thus a clock frequency detection circuitry can be provided to determine such frequency as described herein.

Figure 2:
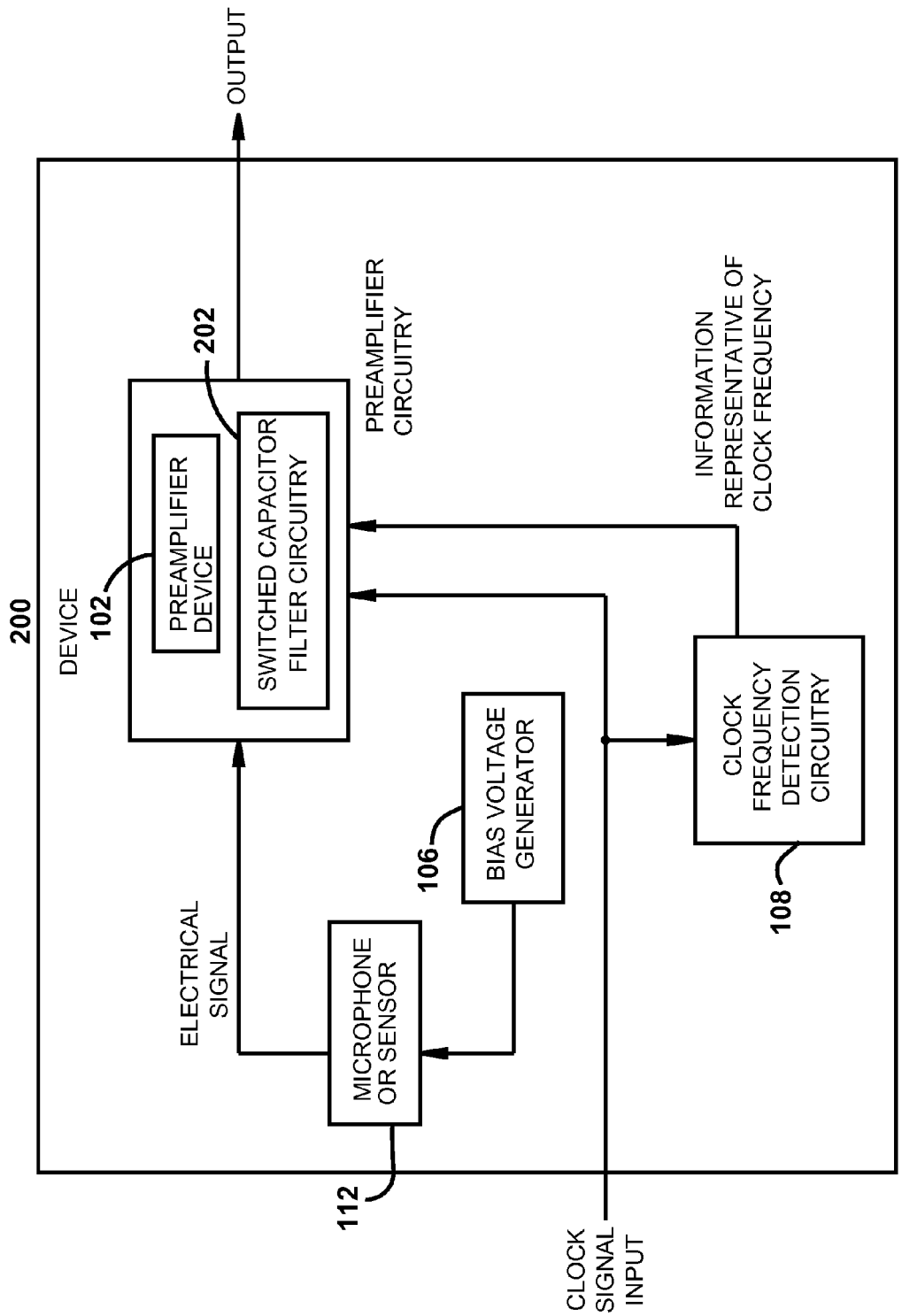
FIG. 2 illustrates an exemplary circuit of a device that provides frequency shaping via a combination of switched capacitor circuitry and clock frequency detection circuitry in accordance with one or more embodiments described herein.

FIG. 2 illustrates an exemplary circuit of a device that provides frequency shaping via a combination of switched capacitor circuitry and clock frequency detection circuitry in accordance with one or more embodiments described herein. Repetitive description of like elements employed in respective embodiments of systems and/or apparatus described herein are omitted for sake of brevity.

As shown, device 200 can include a preamplifier device 102, which includes switched capacitor circuitry 202 having first capacitor circuitry (not shown) and second capacitor circuitry (not shown), microphone or sensor 112, preamplifier device 102, bias voltage generator 106 and/or clock frequency detection circuitry 108. Device 200 provides a design for filtering in the analog domain without the digital filter circuitry 110. As shown, the switched capacitor circuitry 202 can be included as part of the preamplifier device 102. In some embodiments, feedback circuitry (not shown) of the preamplifier device 102 can be implemented using the switched capacitor circuitry 202.

In various embodiments, one or more of the microphone or sensor 112, preamplifier device 102, bias voltage generator 106 and/or clock frequency detection circuitry 108 can be electrically and/or communicatively coupled to one another to perform one or more functions of device 200 (or one or more components of device 200). In some embodiments, the switched capacitor circuitry 202 can include, but is not limited to, capacitors and/or switches that change the impedance and/or frequency response output from the switched capacitor circuitry 202. In some embodiments, changing the impedance includes the switched capacitor circuitry 202 selectively connecting, bypassing or disconnecting particular circuitry of the switched capacitor circuitry.

In this embodiment, the clock frequency detection circuitry 108 can be designed to output an analog signal representative of the clock frequency. In this embodiment, the switched capacitor circuitry 202 can receive the clock signal and the information representative of the frequency of the clock signal. Switched capacitor circuitry 202 can perform filtering using discrete-time signal processing, and no ADC device (e.g., ADC device 104) need be included in the device 200. In some embodiments, the clock frequency detection circuitry 108 can be designed to tune the switched capacitor circuitry 202 filters (e.g., discrete-time analog filters) to increase the likelihood that the behavior of the filters will result in a substantially fixed frequency response across a range of input clock frequencies.

The embodiment of device 200 provides a design that can be employed if the circuit is employed for simple adjustment of a high-pass frequency response of the microphone or sensor 112. As with the digital filter circuitry 110, the frequency response of the switched capacitor circuitry 202 would typically scale based on the frequency of the input clock signal. As such, due to the scaling of the frequency response that is typical, the switched capacitor circuitry 202 can receive information representative of the clock frequency and change the frequency response of the switched capacitor circuitry 202 so as to improve the likelihood that the frequency response of the signal output by the switched capacitor circuitry 202 is fairly constant.

As described, by way of example, but not limitation, the switched capacitor circuitry 202 can include first capacitor circuitry and second capacitor circuitry. Either or both of the first capacitor circuitry or the second capacitor circuitry can be switched on by the switched capacitor circuitry 202. For example, in some embodiments, the switched capacitor circuitry 202 is adapted to receive the clock signal input to the device 200 and selectively and/or dynamically activate or bypass the first capacitor circuitry and/or the second capacitor circuitry based on the information representative of the clock frequency. Selective and/or dynamic activation and/or bypass of the first capacitor circuitry or the second capacitor circuitry can be performed by the switched capacitor circuitry 202 to reduce or eliminate the effect of the frequency of the clock signal on a frequency response of the switched capacitor circuitry 202. In other embodiments, a branch of the switched capacitor circuitry 202 can be bypassed or added into the switched capacitor circuitry 202 to reduce or eliminate the effect of the frequency of the clock signal on a frequency response of the switched capacitor circuitry 202. In other embodiments, the switched capacitor circuitry 202 can divide down differently the external clock to use in the switched capacitor circuitry 202 operations based on the information from the clock frequency detection circuitry 108. The frequency of a switched capacitor circuitry clock directly affects the filter corner of the frequency response of the switched capacitor circuitry 202 in some embodiments. In another embodiment, the switched capacitor circuitry 202 can switch in or out switch capacitor branches as described earlier as well as divide the external clock down by different integers.

An example of a design employing the two sets of capacitor circuitry (e.g., first capacitor circuitry and second capacitor circuitry) and selection of the first capacitor circuitry (versus selection of the second capacitor circuitry) is as follows. A simple one pole resistor-capacitor (RC) filter can be implemented by a charge bucket brigade type of switched capacitor circuitry 202 arrangement using N stages, followed by a large capacitor Cf. If each of the capacitors used in the bucket brigade has value Cb then the filter corner generated by this circuitry is F3db=Fclk*Cb/(2*pi*N*Cf). If the clock frequency changed by ratio (N−1)/N (e.g., Fclk became Fclk*(N−1)/N), then by bypassing at least one of the capacitors in the charge bucket brigade, the number of stages is reduced by N−1 and by inserting into the above formula, F3 dB=[Fclk*(N−1)/N]*Cb/(2*pi*[N−1]*Cf)=Fclk*Cb/(2*pi*N*Cf) results. As such, the N−1 term cancels out and the same F3 dB pole frequency results (as with the original clock). Essentially, as the clock frequency was reduced, the impedance of the switched capacitor circuitry 202 increased and by bypassing one or more portions of the switched capacitor circuitry 202, compensation of the impedance change associated with the clock change resulted and therefore there was no net filter response change.

The variables are as follows: Fclk is the clock frequency used by the switched capacitor circuitry 202 in the example (e.g., bucket brigade); Cb is the value of the switched capacitor circuitry 202 used in each stage of the bucket brigade; N is the number of stages used in the bucket brigade in the example (N can be varied by removing branches or adding more branches into the switched capacitor circuitry 202, which is one of the points of the example). As pointed out in the example, a clock change was countered/offset by reducing the number of stages by 1 (to N−1) by bypassing one stage/branch. The result was no change in the filter pole frequency even though the clock frequency had changed. Cf is the (large) filter capacitor attached to the end of the bucket brigade to provide the filtering capacitor working against the switched capacitor circuitry resistance implemented by the switched capacitors, Cb, in the bucket brigade.

For example, elimination or reduction of the effect can be to eliminate or reduce the scaling of the frequency response of the microphone or sensor 112 and to instead, keep the microphone or sensor 112 frequency response output (shown as "output" in FIG. 2) as approximately constant for any number of different clock frequencies of the input clock signal.

In general, the switched capacitor circuitry 202 is adapted to receive the clock signal and dynamically change the frequency of the internal clock signal used by the switched capacitor circuitry 202. For example, the frequency of the internal clock signal of the switched capacitor circuitry 202 can be derived from the received clock signal based on dividing down by an integer the frequency of the switched capacitor circuitry 202 received clock signal. As another example, the frequency of the internal clock signal can be derived by generating an internal switched capacitor circuitry clock based on the received clock signal.

In some embodiments, the change of the frequency of the internal clock of the switched capacitor circuitry 202 includes multiplying or dividing of the frequency of the received clock signal. By way of example, but not limitation, the clock division takes place once the clock detector signals the value of the received clock frequency and thereby informs the clock division circuitry of how much the clock division circuitry should divide the frequency of the received clock signal. The switched capacitor circuitry 202 would typically divide the frequency of the received clock before using the clock signal for any switched capacitor operations. Often times we divide the clock down to be on the order of a few tens of kHz. This increases the likelihood that any clock ripples on the signal are well beyond audible range (e.g., 20-20 Khz). Second, in order to realize a certain pole frequency, in order to minimize the filter capacitor (Cf above) being used (for area efficiency) the clock rate being used can be reduced by the switched capacitor circuitry 202—as can be seen by formulae above, the filter corner of switch capacitor circuitry 202 filters are proportional to the clock rate being used by switched capacitor circuitry 202. In FIG. 2, the output from the switched capacitor circuitry 202 can include any number of different analog signals including, but not limited to, an analog audio signal indicative of a verbal word spoken into the device (e.g., when the MEMS device is a MEMS microphone).

Although not shown, in some embodiments, a MEMS device can include a MEMS microphone transducer or sensor and an accompanying ASIC electrically and/or communicatively coupled to the sensor. The ASIC can include clock frequency detection circuitry configured to determine the frequency of clock signal applied from a device external to the MEMS device. The ASIC can receive a signal from the MEMS microphone transducer and/or sensor. The ASIC can also receive a clock input along with information indicative of the frequency of the clock signal. The switch capacitor filter can be configured to have an implementation that dynamically changes the internal clock signal depending on the frequency of the received clock signal. In various embodiments, the switched capacitor circuitry can be configured to perform any of a number of the operations described herein.

Figure 3:
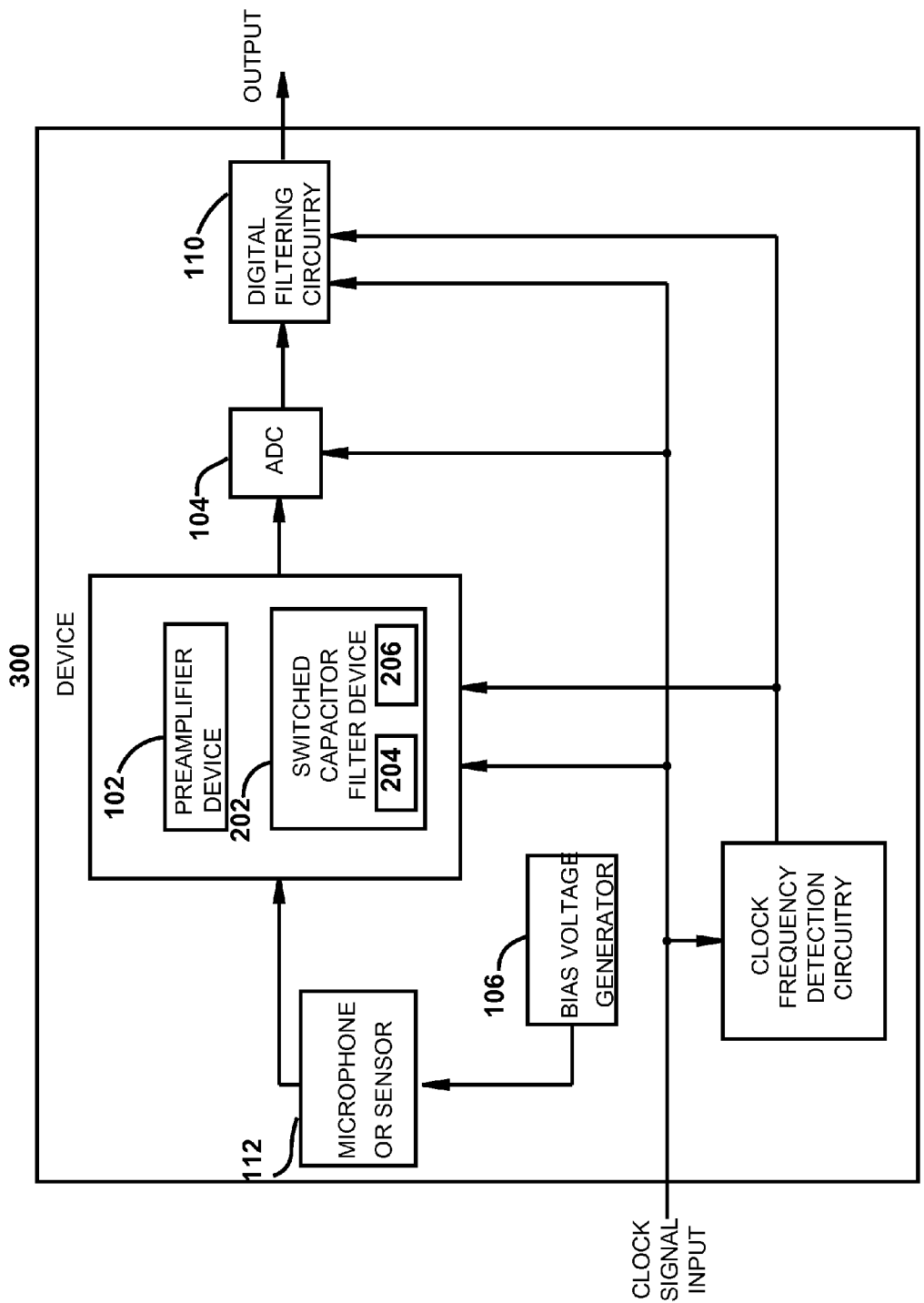
FIG. 3 illustrates an exemplary circuit of a device that provides frequency shaping via a combination of preamplifier device (including switched capacitor circuitry) or digital filter circuitry and clock frequency detection circuitry in accordance with one or more embodiments described herein.

FIG. 3 illustrates an exemplary circuit of a device that provides frequency shaping via a combination of a preamplifier device 102 (including switched capacitor circuitry), and/or digital filter circuitry, and clock frequency detection circuitry in accordance with one or more embodiments described herein. Repetitive description of like elements employed in respective embodiments of systems and/or apparatus described herein are omitted for sake of brevity. As shown, the preamplifier device 102 includes the switched capacitor circuitry 202 and generates an output that is input to the ADC device 104. Device 300 shows a combination of a package that can include the preamplifier device 102 having the switched capacitor circuitry 202 and the digital filter circuitry 110 for flexible use of either device based on the intended manipulation of the frequency of the signal output from the device 300 and/or based on any number of different factors.

Figure 4:
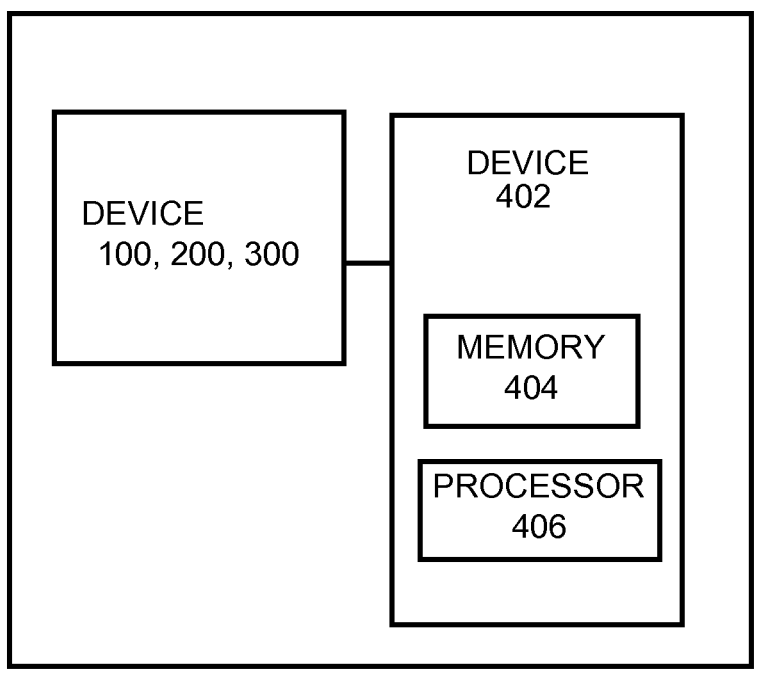
FIG. 4 illustrates an exemplary package that provides frequency shaping in accordance with one or more embodiments described herein with reference to FIGS. 1, 2 and/or 3.

FIG. 4 illustrates an exemplary system that provides frequency shaping in accordance with one or more embodiments described herein with reference to FIGS. 1, 2 and/or 3. Repetitive description of like elements employed in respective embodiments described herein is omitted for sake of brevity.

The system 400 can include a device 402 (e.g., audio processing device, codec), one or more of devices 100 (e.g., MEMS devices or ECMs), 200, 300, memory 404 and/or processor 406. In various embodiments, one or more of the device 402, one or more of devices 100, 200, 300, memory 404 and/or processor 406 can be electrically and/or communicatively coupled to one another to perform one or more functions of system 400.

With reference to FIGS. 1, 2, 3 and/or 4, memory 404 can store computer-executable instructions that can be executed by processor 406. For example, memory 404 can store instructions for performing any number of functions utilizing information generated by clock frequency detection circuitry 108 (e.g., information, values and/or a number of bits associated with or characterizing the frequency of the clock signal input to and/or received by the clock frequency detection circuitry 108), selection of digital filter coefficient values for frequency shaping as described herein or the like. Processor 406 can process computer-readable storage medium computer-executable instructions to perform one or more of the functions described herein with reference to devices 100, 200 and/or 300, including, but not limited to, selectively and/or dynamically changing a first digital filter coefficient value to a second digital filter coefficient value based on the information representative of the frequency of the clock signal input to and/or received by the clock frequency detection circuitry 108 to reduce or eliminate the effect of the frequency of the clock signal on a frequency response of the digital filter circuitry 110. In various embodiments, In various embodiments, the processor 406 and/or digital filter circuitry 110 can be configured to perform any of a number of the operations described herein. In some embodiments, device 402 does not include memory 404 or processor 406.

In some embodiments, within the devices 100, 200, 300, a separate die can have two diaphragms making up the device (e.g., MEMS acoustic sensor) and all the ASIC electronics can condition the signal from the MEMS acoustic sensor and generate frequency shaping are on a second die included in the same overall module package.

In other embodiments, within the devices 100, 200, 300, the device (e.g., MEMS acoustic sensor) and the ASIC electronics that condition the signal from the acoustic sensor and generate frequency shaping is one assembly/chip that is then assembled into the same overall module package.

After frequency shaping is performed, the signal having the desired frequency response as shaped by device 100, 200,300 can be input to device 402 to enable the system 400 to perform one or more functions associated with speech processing, functions of a wearable device or the like. In some embodiments, system 400 is or is included in an automobile, mobile device (e.g., mobile telephone, laptop, tablet, personal digital assistant), wearable article of clothing or the like.

The sets of components shown in FIGS. 1, 2, 3 and/or 4 are merely exemplary and not exhaustive. For example, the system 400 can include the components, devices and/or circuitry of devices 100, 200, 300 and/or other devices, components and/or circuitry as needed or desired depending on the desired functionality of devices 100, 200 and/or 300. In some embodiments, although not shown, system 400 can include switched capacitor circuitry (e.g., switched capacitor circuitry 202) that can receive the clock signal and selectively activate or bypass first capacitor circuitry or second capacitor circuitry of the switched capacitor circuitry based on the information representative of the frequency of the clock signal input to and/or received by clock frequency detection circuitry 108 to reduce or eliminate the effect of the frequency of the clock signal on a frequency response of the switched capacitor circuitry.

For example, in some embodiments, a second clock (not shown) internal to the switched capacitor circuitry 202 can be changed and a portion of the switched capacitor circuitry 202 (e.g., the first capacitor circuitry or the second capacitor circuitry) can be selectively bypassed or activated depending on the frequency of the clock signal that is input to device 200. In other embodiments, the switched capacitor circuitry 202 need not include an internal clock and a portion of the switched capacitor circuitry 202 (e.g., the first capacitor circuitry or the second capacitor circuitry) can be selectively bypassed or activated depending on the frequency of the clock signal that is input to device 200.

In various embodiments described with reference to devices 100, 200, 300, one or more devices and/or components can be implemented via hardware. In various embodiments, the devices 100, 200, 300 can be implemented in hard-coded logic that performs the specific function described herein (as opposed to a general processor).

Although not shown in the drawings, in some embodiments, a package can include a MEMS device (e.g., MEMS microphone or sensor), a processor (or ASIC including a processor) and one or more substrates on which the MEMS device, processor and/or ASIC is provided. In some embodiments, the package can include a lid covering one or more portions of the MEMS device, processor and/or ASIC.

One or more of the embodiments, described herein can alleviate some of the restrictions on the MEMS design making it easier to achieve the overall module (MEMS device, ASIC and/or MEMS device and ASIC incorporated into a package) design target via the frequency shaping described herein.

Figure 5:
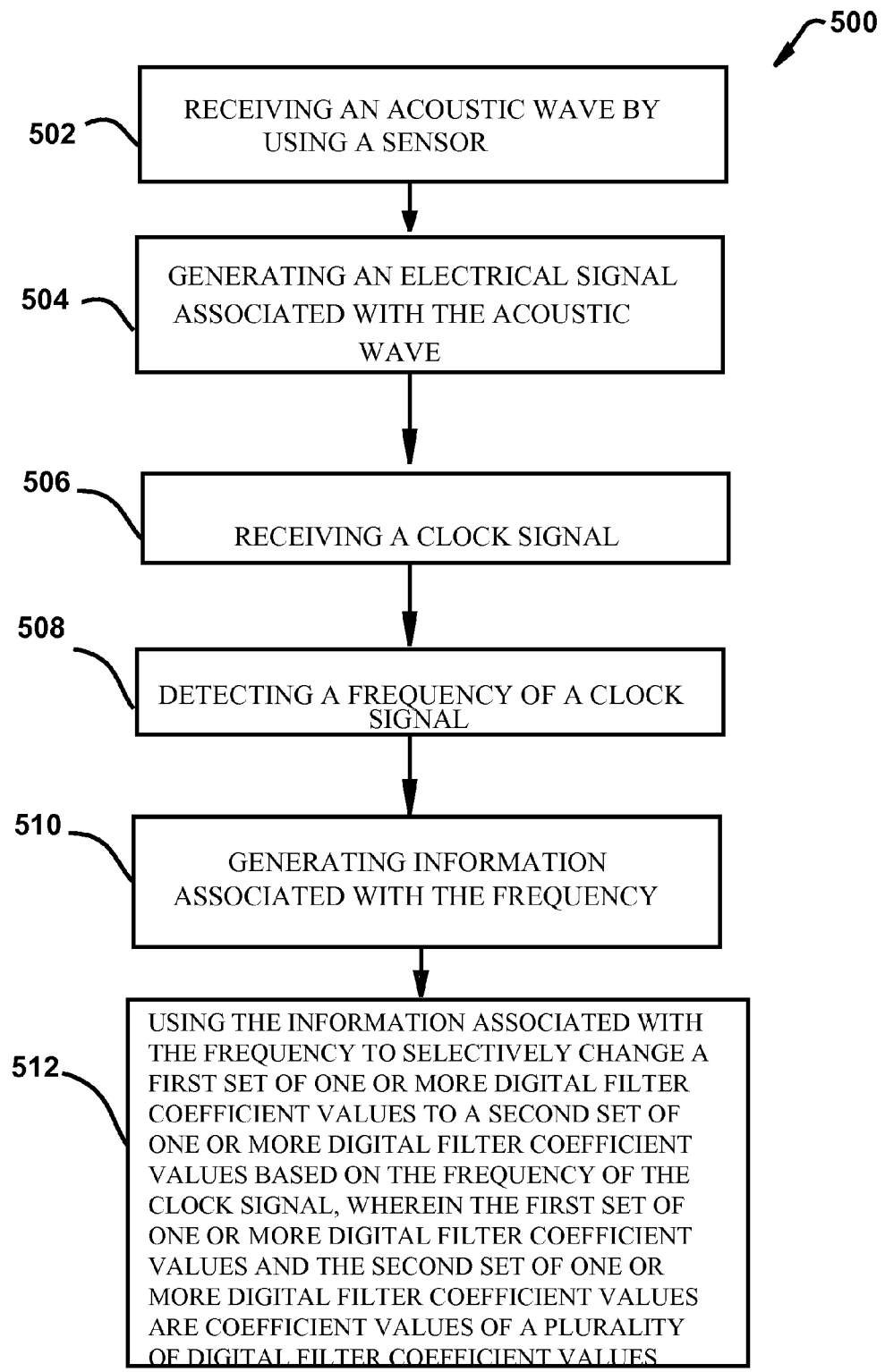
FIGS. 5-7 illustrate exemplary methods of frequency shaping for a device in accordance with one or more embodiments described herein.
Figure 6:
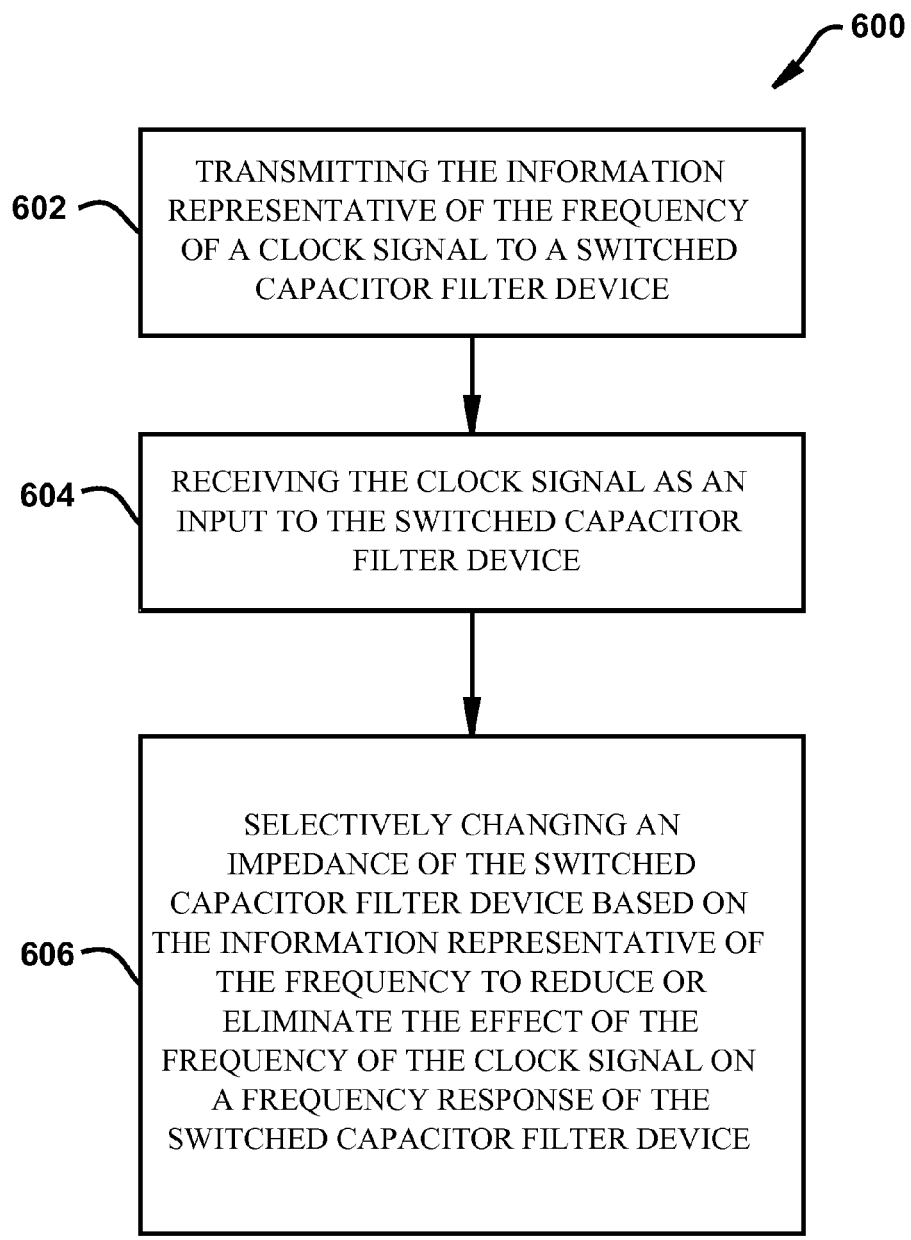
Figure 7:
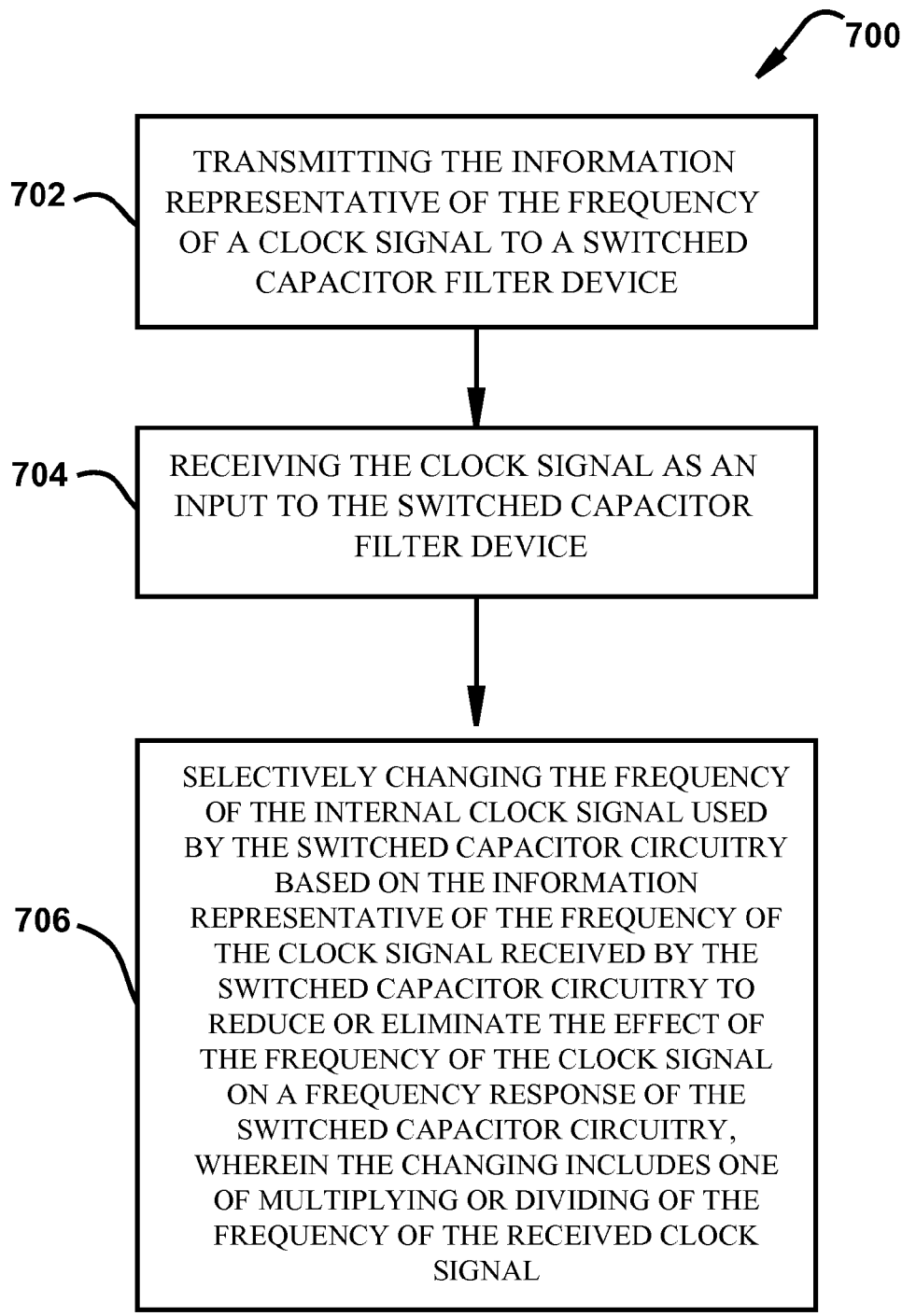

FIGS. 5-7 illustrate exemplary methods of frequency shaping for a device in accordance with one or more embodiments described herein. Turning first to FIG. 5, at 502, method 500 can include receiving an acoustic wave by using an acoustic sensor (e.g., MEMS acoustic sensor). At 504, method 500 can include generating an electrical signal associated with the acoustic wave.

In some embodiments in which the circuit also includes digital filter circuitry (e.g., digital filter circuitry 110), the electrical signal can be a signal output from the acoustic sensor and processed by using an ADC device (e.g., ADC device 104). The digital signal can then be output to the digital filter circuitry and processed by the digital filter circuitry.

In embodiments in which the circuit includes only a discrete-time analog switched capacitor circuitry (e.g., switched capacitor circuitry 202) and/or is operating in a mode in which the switched capacitor circuitry is being used in lieu of use of the digital filter and ADC device (notwithstanding both the switched capacitor circuitry and the digital filter circuitry can both be located in the device for which the method 500 is described), the electrical signal can be the signal output from the acoustic sensor (instead of being a signal also processed by an ADC device).

At 506, method 500 can include receiving a clock signal. At 508, method 500 can include detecting a frequency of a clock signal. At 510, method 500 can include generating a value associated with (or information associated with) the frequency of the clock signal.

At 512, method 500 can include using the information associated with the frequency to selectively change a first set of one or more digital filter coefficient values to a second set of one or more digital filter coefficient values based on the frequency of the clock signal, wherein the first set of one or more digital filter coefficient values and the second set of one or more digital filter coefficient values are coefficient values of a plurality of digital filter coefficient values. In some embodiments, the changing of the digital filter coefficient value can include selectively and dynamically changing the digital filter coefficient value to reduce or eliminate the effect of the frequency of the clock signal on a frequency response of the digital filter. As used herein, the term "dynamically" can mean performed in real-time.

Although not shown, method 500 can also include attenuating or amplifying the electrical signal by using the digital filter circuitry. In some embodiments, the electrical signal can include a signal having an ultrasonic frequency.

Turning now to FIG. 6, at 602, method 600 can include transmitting the information representative of the frequency of a clock signal to switched capacitor circuitry. At 604, method 600 can include receiving the clock signal as an input to the switched capacitor circuitry. At 606, method 600 can include selectively changing an impedance of the switched capacitor circuitry based on the information representative of the frequency to reduce or eliminate the effect of the frequency of the clock signal on a frequency response of the switched capacitor circuitry. In some embodiments, the changing of the impedance can include selectively and dynamically changing the impedance. In FIG. 6, the impedance can be changed by bypassing one or more branches of the switched capacitor circuitry 202 branches or adding one or more switched capacitor circuitry 202 branches to active circuitry of the switched capacitor circuitry 202.

Turning now to FIG. 7, at 702, method 700 can include transmitting the information representative of the frequency of a clock signal to switched capacitor circuitry. At 704, method 700 can include receiving the clock signal as an input to the switched capacitor circuitry. At 706, method 700 can include selectively changing the frequency of the internal clock signal used by the switched capacitor circuitry based on the information representative of the frequency of the clock signal received by the switched capacitor circuitry to reduce or eliminate the effect of the frequency of the clock signal on a frequency response of the switched capacitor circuitry, wherein the changing includes at least one of multiplying or dividing of the frequency of the received clock signal. In some embodiments, the changing of the frequency can include selectively and dynamically changing the frequency.

As compared to the approach in FIG. 6 of adding in or bypassing one or more branches of the switched capacitor circuitry to change the impedance, in FIG. 7, the impedance can be changed by changing the frequency of the internal clock employed by the switched capacitor circuitry.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications can be made to adapt a particular situation or material to the essential scope and spirit.

What is claimed is:

1. A device, comprising:
    a sensor that causes an electrical signal to be generated in response to a sensor measurement;
    clock frequency detection circuitry adapted to receive a clock signal, detect a frequency of the clock signal and generate information representative of the frequency; and
    digital filter circuitry coupled to the clock frequency detection circuitry and adapted to:
        receive the clock signal and the information representative of the frequency;
        access a first set of one or more digital filter coefficient values; and selectively change the first set of the one or more digital filter coefficient values to a second set of one or more digital filter coefficient values based on the information representative of the frequency, wherein the one or more digital filter coefficient values are included within a plurality of digital filter coefficient values, and wherein the selectively changing the first set of one or more digital filter coefficient values to the second set of one or more digital filter coefficient values includes selectively changing the first set of one or more digital filter coefficient values to the second set of one or more digital filter coefficient values to reduce or eliminate an effect of the frequency of the clock signal on a frequency response of a digital filter.

2. The device of claim 1, wherein one or more of the plurality of digital filter coefficient values are hard-wired into the digital filter circuitry.

3. The device of claim 1, wherein one or more of the plurality of digital filter coefficient values are generated from hard-wired ones of the plurality of digital filter coefficient values.

4. The device of claim 1, wherein the clock frequency detection circuitry and the digital filter circuitry are located on an application specific integrated circuit (ASIC) located in the device.

5. The device of claim 1, wherein the digital filter circuitry includes at least one of a high pass filter, a low pass filter or a band pass filter.

6. The device of claim 1, wherein the digital filter circuitry includes an equalizer component adapted to one of reduce or eliminate a resonance peak associated with the electrical signal.

7. The device of claim 1, wherein the digital filter circuitry includes an equalizer component adapted to limit a variation of frequency response from a first defined frequency to a second defined frequency to a third defined frequency, wherein the first defined frequency is lower than the second defined frequency.

8. The device of claim 1, wherein the electrical signal includes a signal having an ultrasonic frequency.

9. The device of claim 1, wherein the digital filter circuitry is adapted to one of attenuate or amplify the electrical signal.

10. The device of claim 1, wherein the device comprises an electret condenser microphone device or a piezoelectric micro-electromechanical systems microphone device.

11. The device of claim 1, wherein the device comprises a micro-electromechanical systems microphone device.

12. The device of claim 1, further comprising:
a switched capacitor circuitry, wherein the switched capacitor circuitry is adapted to receive the clock signal and selectively activate or bypass first capacitor circuitry or second capacitor circuitry of the switched capacitor circuitry based on the information representative of the frequency to reduce or eliminate an effect of the frequency of the clock signal on a frequency response of the switched capacitor circuitry.

13. The device of claim 1, further comprising:
a switched capacitor circuitry, wherein the switched capacitor circuitry is adapted to receive the clock signal and dynamically change the frequency of an internal clock signal before being used by the switched capacitor circuitry and based on the information representative of the frequency to reduce or eliminate an effect of the frequency of the clock signal on a frequency response of the switched capacitor circuitry, and wherein a change of the frequency includes at least one of multiplying the frequency of the clock signal, dividing of the frequency of the clock signal or generating an internal switched capacitor circuitry clock based on the clock signal.

14. A method, comprising:
receiving, by a device, an acoustic wave by using a sensor;
generating an electrical signal associated with the acoustic wave;
receiving a clock signal;
detecting a frequency of a clock signal;
generating information associated with the frequency; and
using, by a digital filter circuitry of the device, the clock signal and the information associated with the frequency to selectively change a first set of one or more digital filter coefficient values to a second set of one or more digital filter coefficient values based on the frequency of the clock signal, wherein the first set of one or more digital filter coefficient values and the second set of one or more digital filter coefficient values are coefficient values of a plurality of digital filter coefficient values, and wherein the selectively changing the first set of one or more digital filter coefficient values to the second set of one or more digital filter coefficient values includes selectively changing the first set of one or more digital filter coefficient values to the second set of one or more digital filter coefficient values to reduce or eliminate an effect of the frequency of the clock signal on a frequency response of a digital filter.

15. The method of claim 14, further comprising:
attenuating or amplifying the electrical signal by using digital filter circuitry, wherein the electrical signal includes a signal having an ultrasonic frequency.

16. The method of claim 14, further comprising:
receiving the clock signal as an input to a switched capacitor circuitry; and
selectively changing an impedance of the switched capacitor circuitry based on the information representative of the frequency to reduce or eliminate an effect of the frequency of the clock signal on a frequency response of the switched capacitor circuitry, wherein the selectively changing the impedance comprises selectively at least one of connecting, bypassing or disconnecting first capacitor circuitry of the switched capacitor circuitry.

17. The method of claim 14, further comprising:
receiving the clock signal as an input to switched capacitor circuitry; and
selectively changing the frequency of an internal clock signal used by the switched capacitor circuitry based on the information representative of the frequency of the clock signal to reduce or eliminate an effect of the frequency of the clock signal on a frequency response of the switched capacitor circuitry, wherein the changing includes at least one of multiplying or dividing of the frequency of the clock signal or generating an internal switched capacitor circuitry clock based on the clock signal.

18. A package, comprising:
at least one of a microphone, motion sensor, a pressure sensor or an environmental sensor adapted to generate an electrical signal;
clock frequency detection circuitry adapted to receive a clock signal, detect a frequency of the clock signal and generate information representative of the frequency; and digital filter circuitry coupled to the clock frequency detection circuitry and adapted to:
receive the clock signal via a first wired connection directly connected to the digital filter circuitry and receive the information representative of the frequency via a second wired connection directly connected to the digital filter circuitry;
access a first set of one or more digital filter coefficient values; and
selectively change the first set of the one or more digital filter coefficient values to a second set of one or more digital filter coefficient values based on the information representative of the frequency, wherein the one or more digital filter coefficient values are included within a plurality of digital filter coefficient values, and wherein a selectively changing of the first set of one or more digital filter coefficient values to the second set of one or more digital filter coefficient values includes a selectively changing of the first set of one or more digital filter coefficient values to the second set of one or more digital filter coefficient values to reduce or eliminate an effect of the frequency of the clock signal on a frequency response of a digital filter.

19. The package of claim 18, wherein the microphone comprises an electret condenser microphone.

20. The package of claim 18, wherein the microphone comprises a micro-electromechanical systems microphone.

21. The package of claim 18, wherein the clock frequency detection circuitry and the digital filter circuitry are located on an application specific integrated circuit (ASIC) located in the package.

22. The package of claim 18, wherein the digital filter circuitry includes at least one of a high pass filter, a low pass filter or a band pass filter.

23. The package of claim 18, wherein the digital filter circuitry includes an equalizer component adapted to one of reduce or eliminate a resonance peak associated with the electrical signal.

24. The package of claim 18, wherein the digital filter circuitry includes an equalizer component adapted to limit a variation of frequency response from a first defined frequency to a second defined frequency to a third defined frequency, wherein the first defined frequency is lower than the second defined frequency.

25. A device, comprising:
at least one of a microphone, motion sensor, a pressure sensor or an environmental sensor adapted to generate an electrical signal;
clock frequency detection circuitry adapted to receive a clock signal, detect a frequency of the clock signal and generate information representative of the frequency; and
switched capacitor circuitry having first capacitor circuitry and second capacitor circuitry and coupled to the clock frequency detection circuitry, wherein the switched capacitor circuitry is adapted to receive the clock signal and information representative of the frequency of the clock signal and selectively activate or bypass the first capacitor circuitry or the second capacitor circuitry based on the information representative of the frequency to reduce or eliminate the effect of the frequency of the clock signal on a frequency response of the switched capacitor circuitry.

26. The device of claim 25, wherein the clock frequency detection circuitry and the switched capacitor circuitry are located on an application specific integrated circuit (ASIC) located in the package.

27. The device of claim 25, wherein the switched capacitor circuitry is further adapted to receive the clock signal and selectively change a frequency of an internal clock signal used by the switched capacitor circuitry based on the information representative of the frequency of the clock signal to reduce or eliminate the effect of the frequency of the clock signal on a frequency response of the switched capacitor circuitry, and wherein a change of the frequency includes at least one of multiplying the frequency of the clock signal, dividing of the frequency of the clock signal or generating an internal switched capacitor circuitry clock based on the clock signal.

28. A system, comprising:
a microphone device having a clock and a clock frequency detector; and
digital filtering circuitry coupled to the microphone device and that is adapted to:
receive, via a first connection, information about the frequency of the clock of the microphone device from the clock frequency detector and receive, via a second connection independent of the first connection, the clock; and
adjust filtering of an electrical signal generated by the microphone device based on the information, wherein adjustment of filtering comprises selective modification of one or more first digital filter coefficient values of the digital filtering circuitry to one or more second digital filter coefficient values based on the information, and wherein the selective modification of the one or more first digital filter coefficient values to the one or more second digital filter coefficient values includes selectively changing the one or more first digital filter coefficient values to the one or more second digital filter coefficient values to reduce or eliminate an effect of the frequency of the clock on a frequency response of a digital filter.

29. The system of claim 28, wherein the digital filtering circuitry is located on an application specific integrated circuit (ASIC) located in the system and distinct from the microphone device, and wherein the ASIC also includes circuitry associated with at least one encoding, decoding, audio speech recognition or ultrasonic gesture detection.

30. An integrated circuit package, comprising:
a clock;
a first chip coupled to the clock comprising:
a sensor, a clock frequency detection circuitry and an interface configured to communicate with a second chip; and
the second chip coupled to the clock and comprising:
digital filter circuitry having analog to digital conversion circuitry, wherein the digital filter circuitry is configured to:
use a signal generated by the clock frequency detection circuitry to generate information representative of the frequency of the clock;
access a first set of one or more digital filter coefficient values; and
selectively change the first set of the one or more digital filter coefficient values to a second set of one or more digital filter coefficient values based on the information representative of the frequency, wherein the one or more digital filter coefficient values are included within a plurality of digital filter coefficient values, wherein the clock is directly connected as an input to the frequency detection circuitry via a first connection wherein the clock is directly connected as an input to the clock frequency detection circuitry via a second connection, and wherein the selective change of the first set of the one or more digital filter coefficient values to the second set of the one or more digital filter coefficient values includes selectively changing the first set of the one or more digital filter coefficient values to the second set of the one or more digital filter coefficient values to reduce or eliminate an effect of the frequency of the clock on a frequency response of a digital filter.

31. A system, comprising:
a clock;
a first chip coupled to a clock and comprising:
  a sensor, an analog to digital conversion circuitry, clock frequency detection circuitry and an interface, wherein the interface is configured to communicate with a second chip; and
  the second chip coupled to the clock and comprising digital filter circuitry configured to:
    use a signal generated by the clock frequency detection circuitry to generate information representative of the frequency of the clock;
    access a first set of one or more digital filter coefficient values; and
    selectively change the first set of the one or more digital filter coefficient values to a second set of one or more digital filter coefficient values based on the information representative of the frequency, wherein the one or more digital filter coefficient values are included within a plurality of digital filter coefficient values, wherein the clock is directly connected as an input to the frequency detection circuitry via a first connection and wherein the clock is directly connected as an input to the clock frequency detection circuitry via a second connection, and wherein the selective change of the first set of the one or more digital filter coefficient values to the second set of the one or more digital filter coefficient values includes selectively changing the first set of the one or more digital filter coefficient values to the second set of the one or more digital filter coefficient values to reduce or eliminate an effect of the frequency of the clock on a frequency response of a digital filter.

32. The system of claim 31, wherein the first and the second chips are located in the same integrated circuit package.

33. The system of claim 31, wherein the first chip is located in a first integrated circuit package and the second chip is located in a second integrated circuit package.

* * * * *